United States Patent [19]

Cosand

[11] Patent Number: 4,975,931
[45] Date of Patent: Dec. 4, 1990

[54] HIGH SPEED PROGRAMMABLE DIVIDER

[75] Inventor: Albert E. Cosand, Agoura, Calif.

[73] Assignee: Hughes Aircraft Company, Los Angeles, Calif.

[21] Appl. No.: 286,435

[22] Filed: Dec. 19, 1988

[51] Int. Cl.⁵ ............... H03K 23/66; H03K 23/68; H03K 21/10; H03K 21/38

[52] U.S. Cl. ................................ 377/52; 377/44; 377/48; 377/110; 377/116; 377/119

[58] Field of Search ............ 377/44, 47, 48, 52, 377/56, 104, 106, 107, 110, 111, 114, 115, 116, 118; 331/47, 48, 49, 51; 364/703

[56] References Cited

U.S. PATENT DOCUMENTS

| | | | |
|---|---|---|---|
| 3,873,815 | 3/1975 | Summers | 377/47 |
| 3,959,737 | 5/1976 | Tanis | 377/48 |
| 4,017,719 | 4/1977 | Kaplan et al. | 377/52 |
| 4,193,037 | 3/1980 | Kyu | 377/110 |
| 4,555,793 | 11/1985 | Benamy | 377/52 |
| 4,633,194 | 12/1986 | Kikuchi et al. | 377/47 |
| 4,658,406 | 4/1987 | Pappao | 377/49 |
| 4,773,031 | 9/1988 | Tobin | 364/703 |
| 4,807,266 | 2/1989 | Taylor | 377/48 |
| 4,809,221 | 2/1989 | Magliocco et al. | 377/48 |
| 4,837,721 | 6/1989 | Carmichael et al. | 364/703 |
| 4,856,032 | 8/1989 | Klekotka et al. | 377/47 |

FOREIGN PATENT DOCUMENTS

| | | | |
|---|---|---|---|
| 0037734 | 4/1981 | Japan | 377/47 |
| 0018128 | 1/1982 | Japan | 377/47 |
| 0018129 | 1/1982 | Japan | 377/47 |
| 0133728 | 8/1982 | Japan | 377/47 |
| 0190724 | 10/1984 | Japan | 377/44 |
| 0003228 | 1/1985 | Japan | 377/47 |

Primary Examiner—John S. Heyman
Assistant Examiner—Tai V. Duong
Attorney, Agent, or Firm—R. A. Hays; R. M. Heald; W. Denson-Low

[57] ABSTRACT

A programmable counter or frequency divider includes the combination of a fixed modulus prescaler (110) and a programmable divider (120, 130, 140, 150, 160) in which the prescaler provides more than a single clock phase to the programmable divider and the programmable divider utilizes the multiple clock phases to allow operation in a true fractional-integer mode. The overall combination of the prescaler and programmable divider functions as a programmable divider for which the minimum increment in the overall divider modulus is less than the prescaler modulus, but the maximum clock frequency usable is the maximum clock frequency of the prescaler.

9 Claims, 7 Drawing Sheets

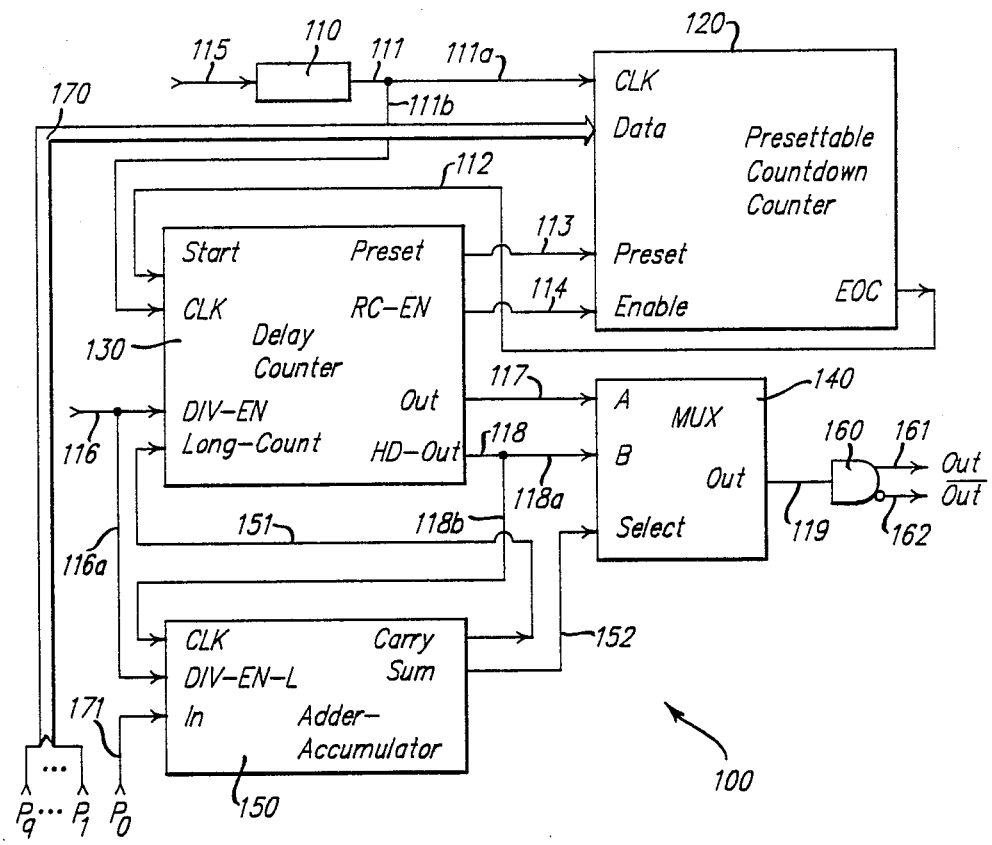
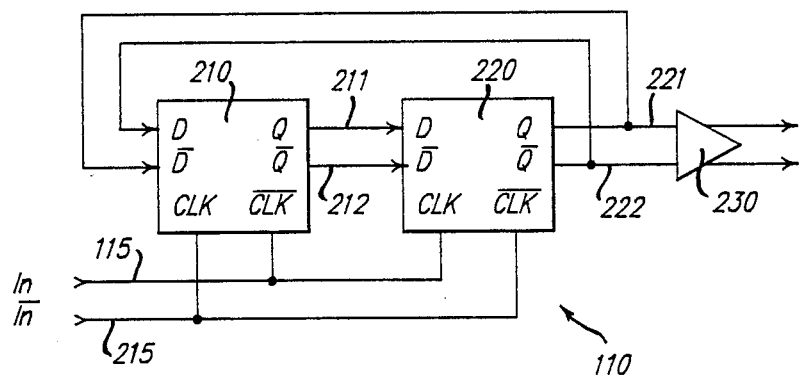
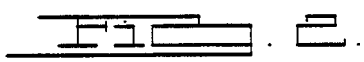

HIGH SPEED PROGRAMMABLE DIVIDER

BACKGROUND OF THE INVENTION

The invention relates generally to programmable dividing or counting circuitry. More specifically, the invention concerns high speed frequency dividers usable in such applications as phase-lock-loop frequency synthesizers or precision timers.

Two desirable properties of a programmable divider are that it operate at a high clock rate and that its division modulus be programmable in the smallest possible steps (integer steps are usually desired). In conventional approaches to programmable dividers, at least some of the circuitry containing the logic gates required for the divider to be programmable is clocked at the input frequency of the programmable divider, which limits the maximum clock frequency that can be used. This is due to the fact that the logic gates employed have inherent delays which in turn limit the maximum external clock frequency able to be used. Higher input frequencies are accommodated by using a divide-by-P fixed-modulus prescaler (where P is commonly 2 or 4) in a stage prior to the programmable divider. The fixed-modulus prescaler can run at a higher speed, since it need only contain latches with no logic gates between the latches. The prescaler normally supplies one clock pulse to the programmable divider for every N clock pulses presented to the prescaler input.

This conventional combination of a prescaler and a programmable divider reduces the possible division moduli to those that are integer multiples of the prescaler modulus N. The fundamental limitation of this conventional arrangement is that, each time the prescaler is driven through its internal cycle by N input clock pulses, only one internal transition of the prescaler wave form is used to clock the subsequently operating programmable divider. The timing information which exists in the remaining N−1 input pulses is not utilized in any way in the conventional approach, but is ignored, and therefore lost.

The concept of sensing all of the internal transitions of a divide-by-two circuit to generate timing signals for a high speed data multiplexer has been described previously in "A Bipolar 4:1 Time Division Multiplexer IC Operating Up To 5.5Gb/s", IEEE Solid-State Circuits Conference Digest of Technical Papers, pages 186–187, February, 1986, Reimann, R. and Rein, H.

However, it is believed that the concept has never before been extended to more general clocked logic circuitry, such as dividers and counters.

Additionally, there are no known high speed programmable non-integer dividers providing an arrangement for evenly spacing divider output pulses where division by non-integers is desired.

For example, in the prior art, division by $N+\frac{1}{2}$, where N is an integer, has been performed by alternately dividing by N and N+1. However, this known approach generates an undesirable subharmonic of the divider output, since the output pulses are unevenly spaced.

In the general case, non-integer division may be effected by alternating between N and N+1 in such a way as to provide an average count which is some desired fraction with a value between N and N+1. Heretofore, obtaining a divisor of N+a/b by dividing by N for "a" times and N+1 for (b−a) times produces an output with subharmonics down to 1/b of the output frequency.

Therefore, there is seen to be a need for providing a programmable divider capable of generating evenly spaced output pulses for non-integer divisor values.

SUMMARY OF THE INVENTION

It is an object of this invention to provide a programmable frequency divider capable of operating at speeds higher than obtainable with conventional known approaches.

It is a further object of the invention to provide a high speed, programmable divider capable of generating evenly spaced output pulses in cases where the divisor is not an integer.

Accordingly, the invention is directed to a programmable divider for dividing a pulse repetition rate of an input pulse train by a preselected number, the programmable divider having prescaling means with an input coupled for receipt of the input pulse train and operative to divide the pulse repetition rate by a predetermined modulus, the prescaling means having at least one output for carrying at least two phases of the divided prescaler output pulses. Programmable counting means having at least one input coupled to the at least one output of the prescaling means also includes data input means for receipt of variable divisor data. The programmable counting means utilizes the at least two phases of the prescaler output pulses to generate an output pulse train having a pulse repetition rate equal to a fraction 1/N of the prescaler output repetition rate, where N is not necessarily an integer and is determined as a function of the divisor data.

The invention additionally contemplates a programmable divider for dividing a pulse repetition rate of an input pulse train by a preselected number, the programmable divider having programmable counting means with an input coupled for receipt of the input pulse train and data input means for receipt of variable divisor data. The programmable counting means is operative to generate an output pulse train having a pulse repetition rate equal to a fraction, 1/N, of the input pulse train pulse repetition rate, where N is determined as a function of the divisor data. The programmable counting means further includes means for evenly spacing in time output pulses at a programmable counting means for non-integer values of N.

BRIEF DESCRIPTION OF THE DRAWING

These and other objects and features of the invention will become apparent from a reading of the detailed description of an illustrative embodiment taken in conjunction with the drawing, in which:

FIG. 1 is a functional block diagram of a programmable divider arranged in accordance with the principles of the invention;

FIG. 2 is a functional block schematic setting forth a logic diagram for the prescaler of FIG. 1;

FIG. 6 is a functional block diagram of an adder-accumulator suitable for use in the overall functional block diagram of FIG. 1;

DETAILED DESCRIPTION

Figure 3:
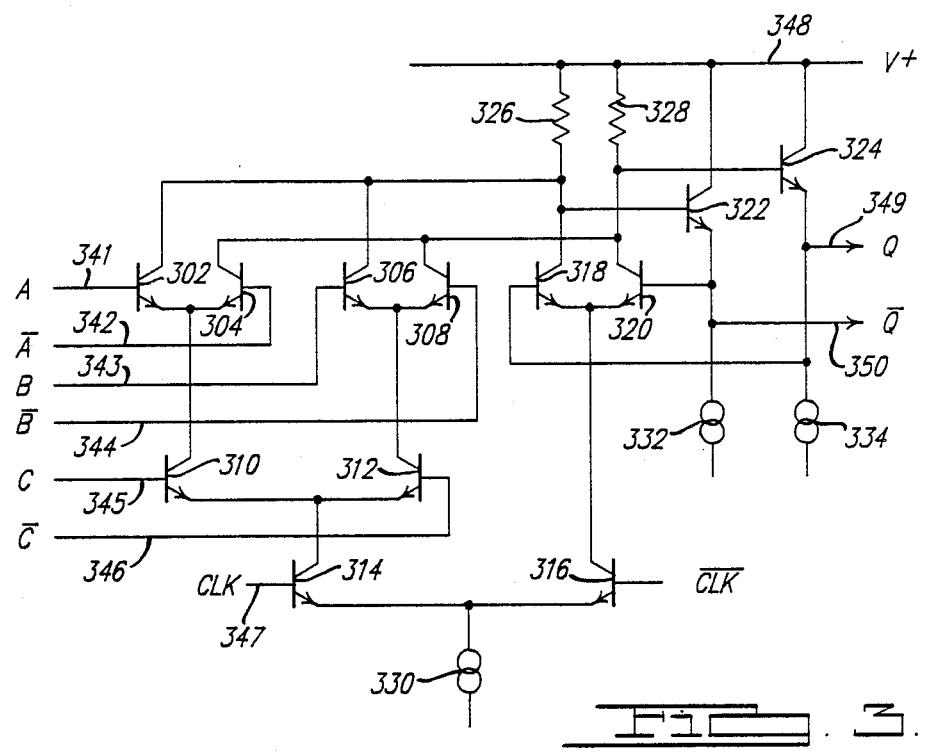
FIG. 3 sets forth a circuit schematic of an example of a two-level series gate coalesced into the input of a differential D latch, suitable for use in various functional blocks of a programmable divider arranged in accordance with the principles of the invention.
Figure 5:
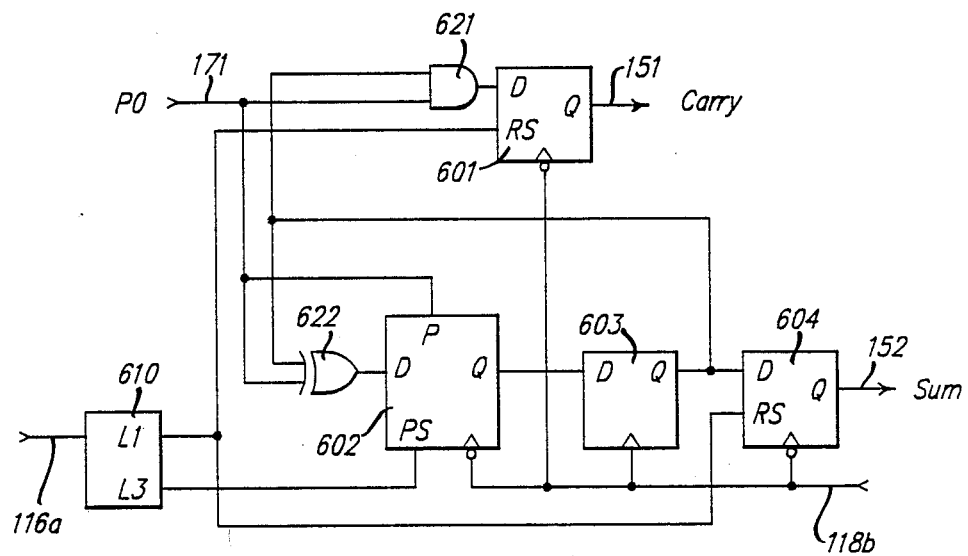
FIG. 5A is a functional block diagram of a delay counter suitable for use in the overall arrangement depicted in FIG. 1.
FIG. 5B is a timing wave form diagram for pertinent parts of the functional schematic set forth in FIG. 5A.

A functional block diagram of a programmable divider 100 arranged in accordance with the principles of the invention is set forth in FIG. 1. It is to be understood that the signal path interconnection shown between the functional blocks are two-wire differential interconnections which carry both the specified signal and its complement. As seen from FIG. 1, a source of input pulses is coupled via path 115 to a prescaler 110 which, in the illustrative embodiment, is a divide-by-two circuit. The prescaler output at path 111 is coupled via path 111a to a CLK input of presettable count-down counter 120 and via path 111b to a CLK input of delay counter 130.

Presettable count-down counter 120 has a multiple line parallel input data bus 170 presenting a digital representation of a numerical value to which the counter is to be preset. Bus 170 is directed to DATA inputs of counter 120. Counter 120 has an output designated EOC (end-of-count) coupled via path 112 to a START input of delay counter 130.

Delay counter 130 has a divide-enable (DIV-EN) input coupled for receipt over path 116 of a divide-enable signal. Delay counter 130 has a PRESET control output 113 coupled via path 113 to a PRESET input of count-down counter 120 and an RC-EN control output coupled via path 114 to an ENABLE input of count-down counter 120.

Delay counter 130 additionally includes a first output OUT coupled via path 117 to input A of multiplexer 140 and a second output HD-OUT coupled via path 118 and 118a to input B of multiplexer 140.

Output HD-OUT of delay counter 130 is additionally coupled via path 118b to a CLK input of adder-accumulator 150. A divide-enable signal is additionally coupled via path 116a to a DIV-EN-L input of adder-accumulator 150. The least significant bit, PO, of information on bus 170 is coupled via path 171 to input IN of adder-accumulator 150. Adder-accumulator 150 has a CARRY output coupled via path 151, to a LONG-COUNT input of delay counter 130. Additionally, adder-accumulator 150 has a SUM output coupled via path 152 to the SELECT input of multiplexer 140.

Multiplexer 140 has an output OUT coupled via path 119 to the input of output buffer 160 which in turn supplies a divider output 161 and its complement 162 for use by apparatus utilizing the divider of the invention.

Prescaler 110 features circuitry which is symmetrical and fully differential, and it provides a differential output to drive the half integer divider comprised of elements 120, 130, 140, 150 and 160. The output 111 of prescaler 110 has the property that the output signal is the voltage difference between two symmetrical, active nodes, such that the complement of the signal is obtained with zero delay by reversing the connections to the output nodes, and the positive-going and negative-going output transitions are equally spaced in time. Thus, both the normal differential output signal and the complement differential output signal of the prescaler can be used as clock phases for the remainder of the circuitry of FIG. 1. The complement clock phase allows data transitions to be clocked at the time of the negative-going edge of the normal clock phase.

Blocks 120, 130, 140, 150 and 160 form a true half-integer programmable divider capable of dividing by any integer or half-integer over a range determined by the width of data bus 170 and the delay incorporated into the delay counter 130 which will be discussed in more detail below. When the divider of FIG. 1 is dividing by a half-integer, it provides equally spaced output pulses which are alternately clocked by a rising or falling edge of the prescaler output signal.

The operation of the half-integer portion of the circuitry of FIG. 1 is most easily understood by initially considering only the presettable count-down counter 120 and the delay counter 130 with the control input 151 at a logic "zero" level. Counter 120 can be preset to a given number P=(P1, P2 ... P9). When enabled via an appropriate signal on path 114, counter 120 counts down to zero from the preset number presented at the DATA input via bus 170. The zero state is decoded in a decoding logic chain, and an end-of-count (EOC) pulse is output on path 112. The delay counter 130 is started by the EOC pulse on path 112 from counter 120 and, in the illustrative embodiment, on the fourth clock edge following the EOC pulse, delay counter 130 will enable counter 120 at its RC-EN output via path 114 to the ENABLE input of counter 120. During the four clock pulse interval that delay counter 130 is active, counter 130 disables presettable counter 120, generates a preset pulse at output PRESET which is coupled via path 113 to the PRESET input of count-down counter 120 and generates the divider output pulse in undelayed and half-clock delayed forms, respectively, at output OUT and HD-OUT. Hence, it will be seen that count-down counter 120 and delay counter 130 function together as a programmable divider with a modulus of N=(P+4).

Two additional features of delay counter 130 are that it provides a one-half clock delayed version of the output pulse at output HD-OUT (clocked by the negative-going edge of the prescaler output, rather than the positive-going edge), and, when the LONG-COUNT input at path 151 is high, delay counter 130 enables count-down 120 after five clock pulses rather than four. These two features, along with adder-accumulator 150 control functions and the functions of multiplexer 140 are used for half-integer division. Division by $N+\frac{1}{2}$ can be approximated by alternatively dividing by N and N+1, but this produces unevenly spaced output pulses. In accordance with the invention, evenly spaced output pulses at 161 and 162 are obtained by alternating between N and N+1 as the divisor and simultaneously using multiplexer 140 to select the divider output pulse alternately from the normal and the one-half clock delayed outputs of delay counter 130 at OUT, 117, and HD-OUT, 118, respectively. When the divisor is N, the output of the programmable divider is delayed one-half clock period, and on the next cycle, when the divisor is N+1, the output is generated at the nominal time in phase with the signal transitions at prescaler output 111. This arrangement provides a string of output pulses evenly spaced every $N+\frac{1}{2}$ clock periods of the prescaler output.

Adder-accumulator 150 adds the least significant bit P0 to a running one-bit sum on each cycle of operation of the divider. The sum bit at output SUM controls multiplexer 140 over path 152 to select the normal or the half-bit-delayed outputs presented over paths 117 and 118a, respectively, to input A and B of multiplexer 140. The CARRY output of adder-accumulator 150 is used to enable the long (5 clock period) count of delay counter 130 by coupling an appropriate control signal via path 151 to the LONG-COUNT of delay counter 130. The use of an adder-accumulator in this matter insures that the number of counts between output pulses of the divider will be correct, even for the first divider cycle after the modulus has been changed from an integer to a half-integer, or vice versa. For the half-integer divider of the embodiment of FIG. 1, if it is not required that the divider operate correctly on the first cycle after a programmed divisor is changed, a simpler circuit that divides by two when P0=1 and sets to zero when P0=0 could replace adder-accumulator 150 to drive both the SUM and CARRY outputs shown for element 150 of FIG. 1.

Output buffer 160 converts the low level differential logic signal coupled at path 119 to conventional ECL voltage levels for use by apparatus coupled to the divider output 161.

With the arrangement shown, the programmable divider has an overall modulus with a programmable increment less than the prescaler modulus and has a maximum operating frequency equal to a maximum operating frequency of the prescaler.

The logic diagram of prescaler 110 of FIG. 1 is set forth in FIG. 2. Input clock pulses are coupled via path 115 to a CLK input of D-type latch 210 and to a CLK input of D-latch 220, while an inverted or complimentary version of the input clock pulse train is coupled via path 215 to a CLK input of latch 210 and to a CLK input of latch 220. The Q output of latch 210 is coupled via path 211 to the D input of latch 220, while the Q output of latch 210 is coupled via path 212 to the D input of latch 220. The Q output of latch 220 is coupled via path 221 to a first input of output buffer 230 and to the D input of latch 210, while the Q output of latch 220 is coupled via path 222 to a second input of differential output buffer 230 and to the D input of latch 210.

As seen from FIG. 2, prescaler 110 consists solely of D latches, and no logic gates are required between stages of the critical signal path. Since no intermediate logic gates are required between the latches, the arrangement shown is generally the fastest logic circuit which can be built with a given process technology. Additionally, with the arrangement shown, latch circuit modifications to increase speed can be effected without regard as to how such changes would affect the difficulty of coalescing logic gate functions into the latch itself.

The half-integer divider portion of the overall arrangement of FIG. 1 is formed by the combination of presettable counter 120, delay counter 130, adder-accumulator 150 and the multiplexer 140. The details of the presettable count-down counter 120 are set forth in FIG. 4. Input CLK of count-down counter 120 over path 111a is coupled to a clock input of D latch 401a for which latch output Q follows input D when the clock input is low and latches when the clock input is high. Path 111a is additionally coupled to a clock input of D-latch 401b for which Q follows the D input when the clock is high and latches when the clock input is low. The ENABLE input at path 114 is coupled to a first input of AND gate 442 and to a first input of AND gate 441. The output of AND gate 442 is coupled to a first input of OR gate 443, while the output of AND gate 441 is coupled to a second input of OR gate 443. Programming data bit P1 is coupled via path 431 to a second input of AND gate 441. The output of OR gate 443 is coupled to the D input of latch 401a, while the Q output of latch 401a is coupled to the D input of latch 401b. The Q output of latch 401b is coupled via path 450-1 to a second input of AND gate 442 and to the clock inputs of latches 402a and 402b.

Figure 4:
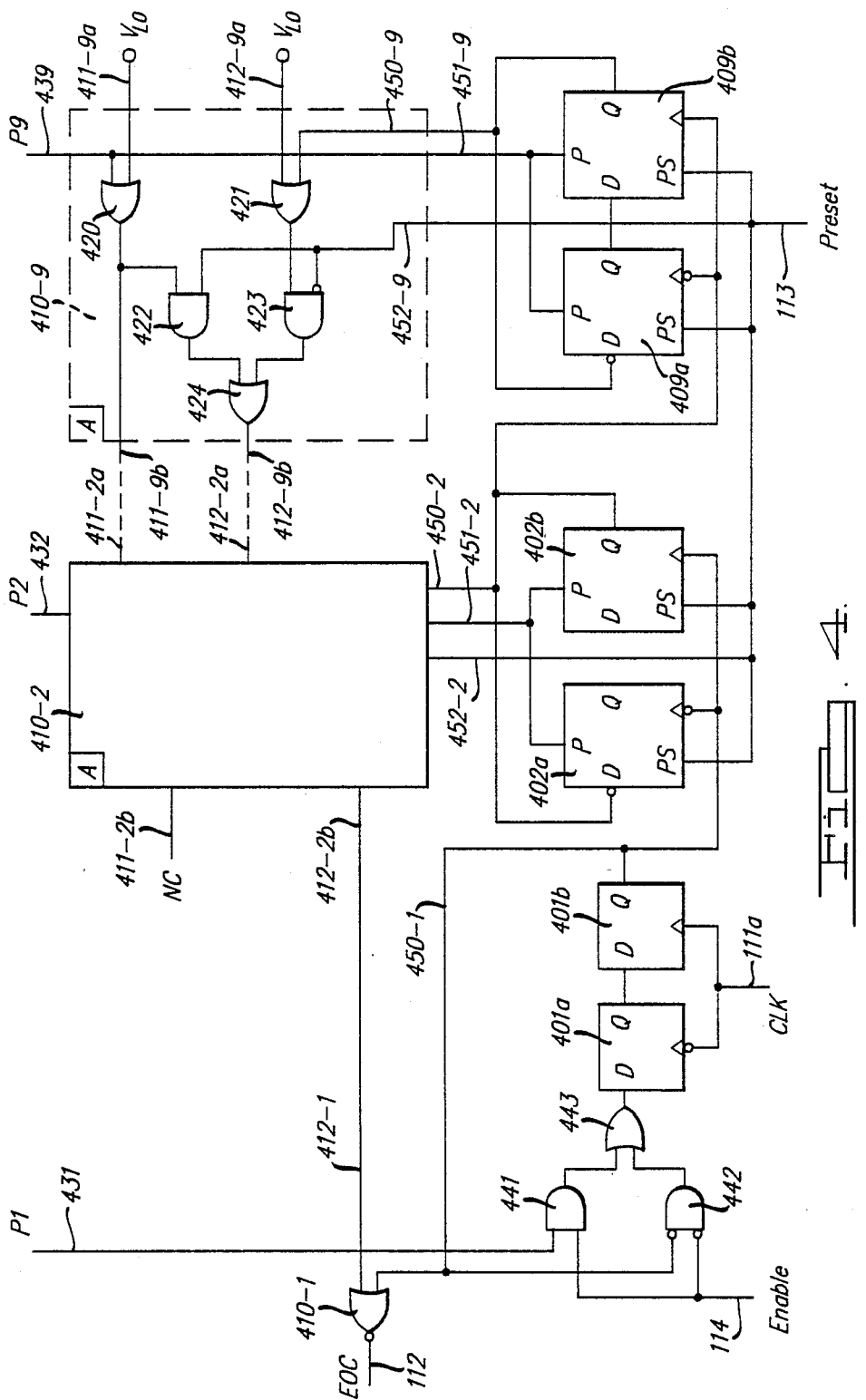
FIG. 4 is a functional block diagram of a presettable count-down counter suitable for use in the overall arrangement set forth in FIG. 1.

The decoding logic chain for the count-down counter set forth in FIG. 4 is represented by a series of blocks 410-9 through 410-2, only two of which are specifically shown in the block diagram of FIG. 4. Each of the decoding chain blocks is designated A to represent the fact that the logic details set forth in block 410-9 are replicated in each of the blocks 410-2 through 410-8. Hence, the detailed functional interconnections will be set forth only with reference to the final or ninth stage of the counter depicted in FIG. 4.

Additionally, as seen from the functional schematic representation of FIG. 4, each stage of counter 120 is comprised of a pair of D-type latches with the clock inputs of each pair of a given stage coupled to the Q output of the second latch of a preceding stage and to the D input to the first latch of the pair of the preceding stage. Also, it will be understood that the Q output of the first latch of the pair of each stage is coupled to the D input of the second latch of the pair.

The decoding logic at each stage of the decoding chain, as has been mentioned previously, is replicated in each stage except the first. Each decoding logic stage may be described with reference to block 410-9. The highest order input data bit at P9 is coupled to a first input of OR gate 420 and to the P inputs of D-type latches 409a and 409b via path 439. The second input to OR gate 420 in the highest stage 410-9 of the decoding chain is coupled to static logic zero or low state $V_{LO}$, and it will be understood that the corresponding second input to a replicated OR gate in the preceding stage will be coupled to path 411-9b.

Output Q of latch 409b is coupled to a first input of OR gate 421 via path 450-9, while a second input at 412-9a is coupled to static logic zero or low state $V_{LO}$ at the highest order decoding logic block 410-9. It will be understood that a corresponding second input to a replicated gate 421 in a preceding stage will be coupled to path 412-9b.

An output of OR gate 420 is coupled to path 411-9b and to a first input of AND gate 422. An output of OR gate 421 is coupled to a first input of AND gate 423. A PRESET input signal over path 113 is coupled to the PS inputs of all the D-type latches in stages 2 through 9 of counter 120 and additionally, is coupled via path 452-9 to a second input of AND gate 423 and a second input of AND gate 422. The outputs of AND gates 422 and 423 are respectively coupled to first and second inputs of OR gate 424 whose output 412-9b will be coupled to the second input of a replicated OR gate corresponding to gate 421 in a preceding decoding logic block A.

The decoding chain has a final block corresponding to the first stage of the counter which is different from the decoding logic blocks 410-2 through 410-9, and this final decoding stage is comprised essentially or NOR gate 410-1. NOR gate 410-1 has a first input coupled via path 412-1 to output 412-2b of the second stage decoding block 410-2. A second input to NOR gate 410-1 is coupled to the Q output of first stage latch 401b.

It will be seen therefore that the logic elements arranged and as shown in FIG. 4 comprise a ripple counter. Only the first stage (latches 401a and 401b) is required to operate at the input clock rate carried via path 111a. Succeeding stages 2 through 9 operate at lower speeds and hence can be made to dissipate less power. The decoding logic shown allows all of the stages above the first to be identical except for changes in resistor values to scale the power. The preset function as controlled over path 113 presets each node of the decode chain rather than allowing the preset data to ripple through the stages of the ripple counter This arrangement allows the preset to be accomplished in a much shorter time than would otherwise be feasible in other more conventional arrangements. The logic state to which each node in the counter is to be preset is provided by an ancillary decode chain controlled directly by the program data (P1–P9) as shown in the logic diagram 410-9, for example, of FIG. 4.

As seen from FIG. 4, the first counter stage comprised of latches 401a, and 401b is preset when the ENABLE input is logic high, or one, and is then free to count incoming pulses from the prescaler output via the CLK input when the ENABLE input is logic low or zero. The latches in the second and subsequent stages include a preset control input PS which overrides the clock input and sets the latches to the state present on the stage's corresponding data (P−) input.

The actual implementation in current-mode differential logic of the decoding logic set forth in FIG. 4 has little effect on the delay of data through the critical paths of the counter.

It should be noted that the invention contemplates other possible decoding chain arrangements and is not limited to the case where each node of the decoding chain is associated with a corresponding single counter stage. A decode chain utilizing three-input, rather than two-input, gates could have a node associated with two ripple counter stages. Other decoding arrangements with multiple nodes could also benefit from the concept of presetting to a value determined by a parallel decode chain.

To further improve the speed characteristics of the overall divider circuitry, it has been found preferable to coalesce logic elements such as shown schematically in FIG. 4 at gates 441, 442 and 443 into the D input of the latch element 401a itself. One example of a two-level series gate coalesced into the input of a differential D latch is set forth for example in FIG. 3. With the interconnections shown, the gate function illustrated in FIG. 3 is a two-input multiplexer. When CLK is a logic high or 1, the Q output of the circuit will equal (A*C)+(B*C), which is the function performed by gates 441, 442, and 443 of FIG. 4. This coalescing approach is used wherever possible throughout the circuitry of FIG. 1 to improve the operating speed capability of the programmable divider disclosed.

Figure 5A:
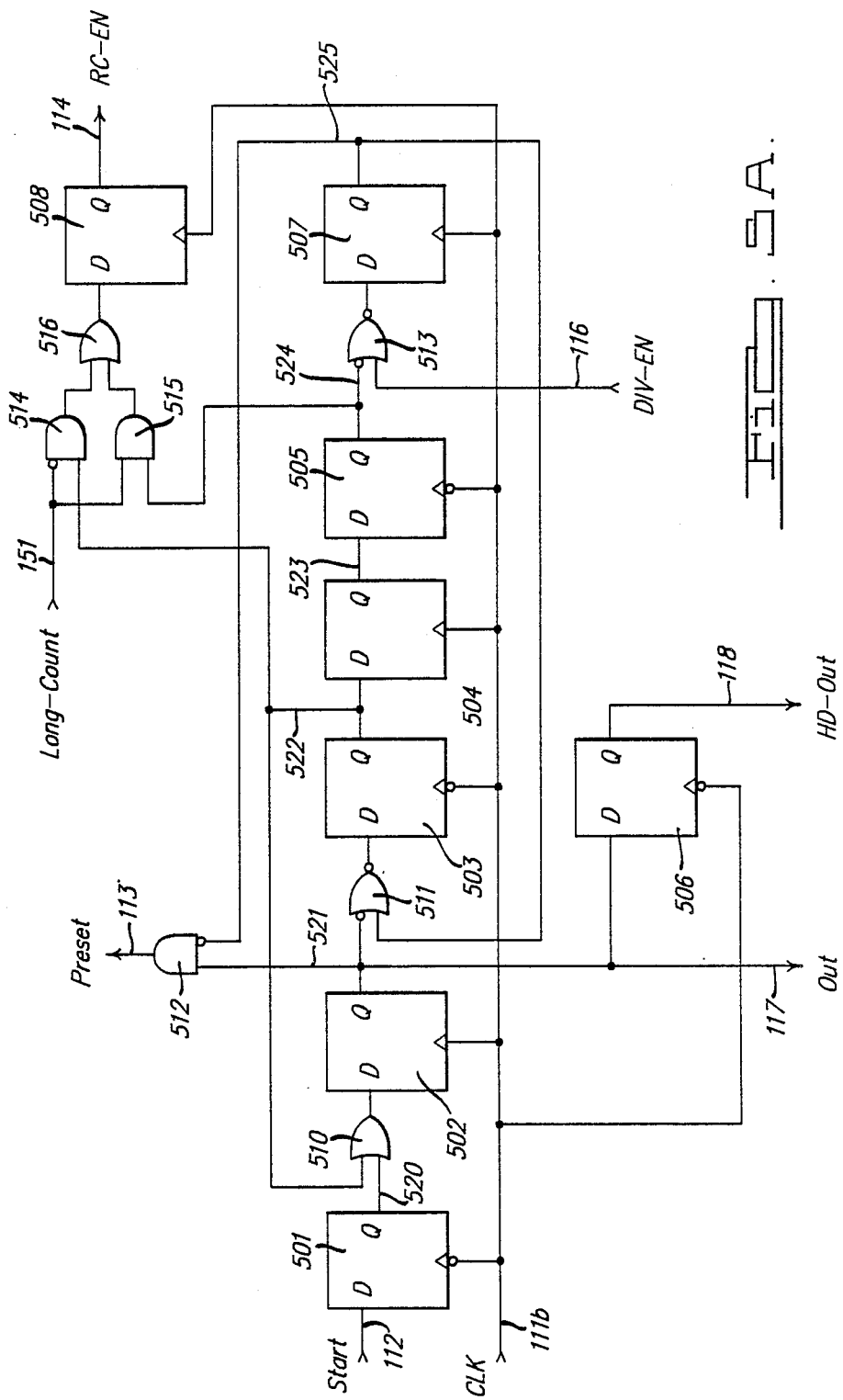
Figure 5B:
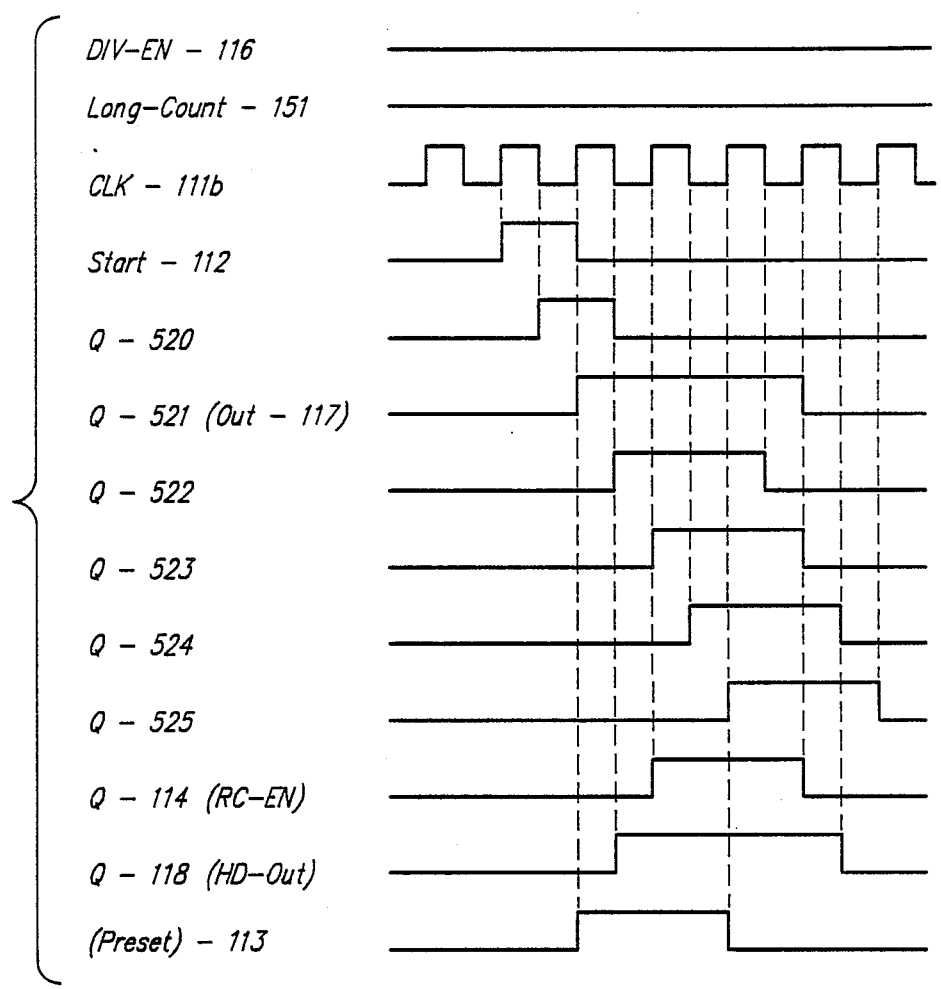

The delay counter 130 of FIG. 1 is set forth in functional block diagram detail in FIG. 5A, and its operation is most easily explained by simultaneous reference to the timing diagram of FIG. 5B. START input at path 112 (which corresponds to the EOC output of countdown counter 120) is coupled to the D input of latch 501. The CLK input at path 111b is coupled to the clock inputs of D-type latches 501, 502, 503, 504, 505, 506, 507 and 508.

The Q output of latch 501 is coupled via path 520 to a first input of OR gate 510. The Q output of latch 502 is coupled via path 521 to a first input of AND gate 512, to the OUT output at path 117 and to the D input of latch 506. The Q output of latch 503 is coupled via path 522 to a second input of OR gate 510 and to a first input of AND gate 514. Additionally, the Q output of latch 503 is coupled to the D input of latch 504. The Q output of latch 504 is coupled via path 523 to a D input of latch 505. The Q output of latch 505 is coupled to a first input of AND gate 515 and to a first input of NOR gate 513. The divide-enable input (DIV-EN) at path 116 is coupled to a second non-inverting input of NOR gate 513. The output of NOR gate 513 is coupled to a D input of latch 507, whose Q output is coupled via path 525 to a second inverting input of AND gate 512 and to a second input to NOR gate 511.

An output of AND gate 512 comprises the PRESET output of the delay counter 130 at path 113. The HD-OUT output of the delay counter at path 118 is taken from the Q output of latch 506, while the RC-EN output of counter 130 at path 114 is taken from the Q output of latch 508.

The LONG-COUNT input at path 151 is coupled to an inverting input of AND gate 514 and an input of AND gate 515. The outputs of AND gates 514 and 515 are respectively coupled to first and second inputs of OR gate 516, which has its output coupled to the D input of latch 508.

With the arrangement shown in FIG. 5A, the delay counter 130 of FIG. 1 consists of a master and slave latch arrangement with logic interspersed so as not to require more than a single two-level current steering gate between any two latches. The logic gates shown are all coalesced into the inputs of their corresponding latches. The START signal is identical to the end-of-count signal generated by the last gate in the decoder in the ripple counter of FIG. 4. That last decode gate of FIG. 4 designated 410-1 is coalesced into the input of latch 501.

As seen from the delay counter timing diagram of FIG. 5B, when LONG-COUNT at path 151 is a logic low, as shown, the ripple counter enable (RC-EN at path 114) goes to a logic low condition on the fourth clock edge after the START signal goes to a logic high state. If LONG-COUNT is logic high, latch 508 is driven from latch 505 rather than from latch 503, such that RC-EN goes to a logic low condition on the fifth edge after the START signal appears rather than after the fourth edge. The normal output signal for the divider to be fed to the multiplexer is taken from latch 502, and the one-half clock interval delayed output pulse is taken from latch 506. Hence, the delay counter varies between four and five delaying counts in accordance with the logic state of the signal appearing at the LONG-COUNT input at path 151.

A functional block diagram of an adder-accumulator suitable for use with the invention is set forth in FIG. 6. The divide-enable input at path 116a is coupled to the input of a signal level shifter 610 having two outputs L1 and L3 which for logic state purposes, are identical. Output L1 of shifter 610 is coupled to a reset input of D latch 601 and to a reset input of D latch 604, while output L3 is coupled to a presetting input PS of latch 602.

The least significant programming data bit PO is coupled via path 171 to a first input of coalesced AND gate 621 and to a first input of coalesced exclusive OR gate 622 and to the P input of latch 602 The HD OUT output of delay counter 130 is coupled via path 118b to the clock inputs of latches 601, 602, 603 and 604. The output of coalesced AND gate 621 is coupled to the B input of latch 601, while the output of coalesced exclusive OR gate 622 is coupled to the D input of latch 602. The CARRY output of the adder-accumulator at path 151 is taken from the Q output of latch 601, while the SUM output of the adder-accumulator at path 152 is taken from the Q output of latch 604.

The Q output of latch 602 is coupled to the D input of latch 603. The Q output of latch 603 is coupled to the D input of latch 604 and to second inputs of both AND gates 621 and exclusive OR gate 622.

With the latch elements arranged as shown in FIG. 6 the adder-accumulator has a CARRY output which goes high one divider cycle earlier than the SUM output. When the divider of FIG. 1 is programmed to a half-integer modulus, divisor data bit PO equals 1, so that the SUM and CARRY outputs of the one bit running sum maintained on successive occurrences of PO will alternate, with SUM equal logic 1 and CARRY equal logic zero on one cycle and with their respective logic states reversed on the next cycle. If the SUM output is then delayed one cycle, the CARRY and the delayed SUM outputs will cycle together alternating between both at logic one and both at logic zero. This is required for the programmable divider to correctly divide by a half-integer. Hence, the one bit adder-accumulator of FIG. 6 adds the input bit to the previous state of the accumulator and provides one SUM bit and one CARRY bit. The clock is phased such that the respective outputs change on the falling edge of the clock transitions. As explained above, the SUM output selects between the normal and half-bit-delayed output pulses from delay counter 130 of FIG. 1, while the CARRY bit determines when the delay counter cycle is increased by one count.

The multiplexer 140 and output buffer 160 of FIG. 1 are conventional differential circuits well known in the art. Therefore, their details are not further set forth in this description.

The above description of the illustrative embodiment has assumed ideal operation in the sense that the delay from a clock edge at the prescaler input to the programmable divider output is independent of whether the nominal or the half-bit-delayed output of delay counter 130 is selected by multiplexer 140 in conjunction with adder-accumulator 150. In practice, this is not precisely correct, in that when the half-integer counter is operating in the half-integer mode there may be some small deviation from ideal timing on alternate output pulses of the overall programmable divider resulting in an unwanted subharmonic frequency component of the divider output. This would most easily be seen with a spectrum analyzer display of the divider output frequency. The observed subharmonic line is typically greater than 30 dB below the level that would be obtained if a simple alternation between divide-by-N and divide-by-N+1 were used to approximate the divide-by-(N+½) operation. The exact degree of suppression of the subharmonic depends on how accurately the clock-to-data delay is matched between the normal and the half-bit-delayed output. With careful circuit layout the clock-to-data delay can be matched well enough to avoid deleterious effects on the operation of a practical phase-locked-loop circuit.

The half-integer divider disclosed with reference to FIG. 1 through FIG. 6 has a low minimum modulus, good speed/power performance and is easy to lay out as an LSI circuit, but the described approach is by no means the only practical construction for a half-integer divider operating in accordance with the principles of the invention. For example, a pulse-swallowing counter, based on a dual modulus prescaler and two control counters could probably be modified in accordance with the invention into a true half-integer divider, although it would be difficult to obtain a minimum modulus as low as that realized with the arrangement disclosed in FIG. 1.

The circuit of FIG. 1 uses two output signals (the clock and its complement) from a prescaler to clock a half-integer divider to obtain overall integer programmability at the prescaler input. The divide-by-two prescaler can also be arranged to provide quadrature output so that all of the timing information available from both rising and falling edges of the input clock is preserved. One method of providing such quadrature outputs would be to use outputs from both latches 210 and 220 of prescaler 110 of FIG. 2. In this manner, all of the timing information available from both the rising and falling edges of the CLK input would be available for use by the programmable divider circuitry. Using the quadrature outputs, a half-integer divider arranged in accordance with the invention could readily be extended to include a wider adder-accumulator multiplexer to select outputs with finer increments of delay, if all clock transitions from the prescaler were available to generate the delays. For example, if the quadrature outputs of a divide-by-two prescaler were also supplied, a quarter-integer divider could be used to give an overall half-integer programming capability at the prescaler input. In this case, the suppression of subharmonics in the divider output would be limited by the degree to which the positive and negative zero-crossings of the input clock were evenly spaced. The true fractional integer divider could even be clocked directly from an input signal with no prescaler, with the appropriate clock phases developed by hybrid junctions and summers. This would be potentially useful for minimizing the overall multiplication of the reference frequency in a phase-locked-loop synthesizer in which multiplied reference noise is a limitation. Such an approach would also allow for a faster settling time than could otherwise be achieved for a given output frequency spacing.

Figure 7:
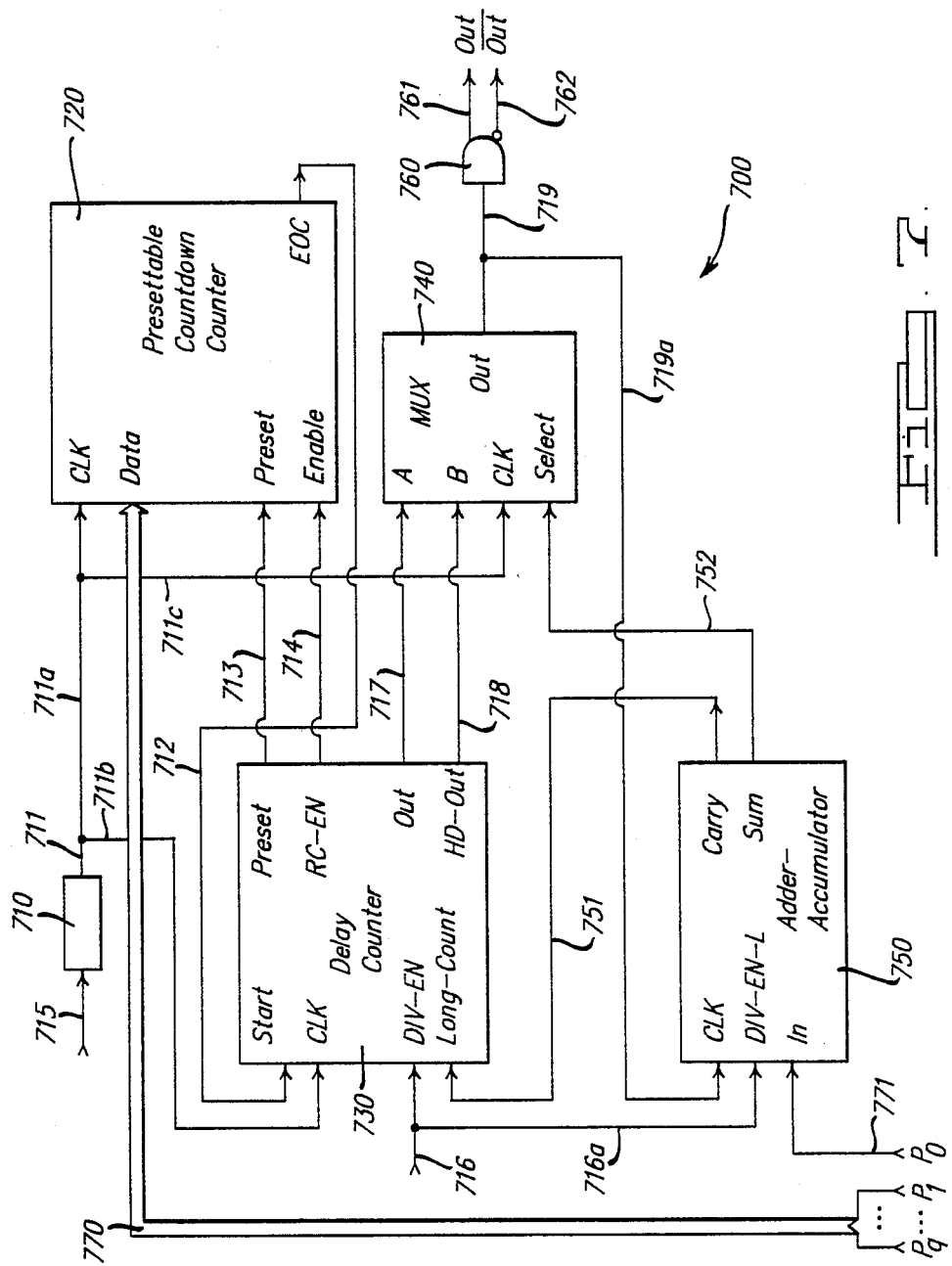
FIG. 7 is a functional block diagram of an alternative embodiment of the divider set forth in FIG. 1.

A second embodiment of a programmable divider designed in accordance with the principles of the invention is depicted in the block diagram of FIG. 7. The divider of FIG. 7 is substantially similar to that of FIG. 1, except for the output multiplexer 740 which is basically comprised of a clocked latch.

As seen from FIG. 7, a source of input pulses is coupled via path 715 to a prescaler 710 which, for this example, comprises a divide-by-two circuit. The prescaler output at path 711 is coupled via path 711a to a CLK input of count-down counter 720, via path 711b to a CLK input of delay counter 730, and via path 711c to a CLK input of output multiplexer 740.

Presettable count-down counter 720 has a multiple line parallel input data bus 770 presenting a variable program-determined representation of a numerical value to which the counter is to be preset. Bus 770 is directed to DATA inputs of counter 720. Counter 720 has an output designated EOC (end-of-count) coupled via path 712 to a START input of delay counter 730.

Delay counter 730 has a divide-enable (DIV-EN) input coupled for receipt over path 716 of a divide-enable signal. Delay counter 730 has a PRESET control output coupled via path 713 to a PRESET input of count-down counter 720 and a RC-EN control output coupled via path 714 to an ENABLE input of count-down counter 720.

Delay counter 730 additionally includes a first output OUT coupled via path 717 to input A of multiplexer 740 and a second output HD-OUT coupled via path 718 to input B of multiplexer 740.

Output 719 of multiplexer 740 is coupled via path 719a to a CLK input of adder-accumulator 750. A divide-enable signal is additionally coupled via path 716a to a DIV-EN-L input of adder-accumulator 750. The least significant bit, PO, of information on bus 770 is coupled via path 771 to input IN of adder-accumulator 750. Adder-accumulator 750 has a CARRY output coupled via path 751 to a LONG-COUNT input of delay counter 730. Additionally, adder-accumulator 750 has a SUM output coupled via path 752 to the SELECT input of multiplexer 740.

Multiplexer 740 has an output OUT coupled via path 719 to the input of output buffer 760 which in turn supplies a divider output 761 and its complement 762 for use by apparatus utilizing the divider of the invention.

Prescaler 710, like prescaler 110 of FIG. 1, features circuitry which is symmetrical and fully differential, and it provides a differential output to drive the half integer divider comprised of elements 720, 730, 740, 750 and 760. The output 711 of prescaler 710 has the property that the output signal is the voltage difference between two symmetrical, active nodes, such that the complement of the signal is obtained with zero delay by reversing the connections to the output nodes, and the positive-going and negative-going output transitions are equally spaced in time. Thus, both the positive-going edge and the negative-going edge of the prescaler output can be used as clock phases by the remainder of the circuitry of FIG. 7, as was the case for the embodiment of FIG. 1.

The configuration and operation of the divider of FIG. 7 is substantially similar to that of FIG. 1, with two important exceptions. The first difference, as mentioned above, involves use of a clocked latch as the output multiplexer 740. The SUM output of adder-accumulator 750 causes multiplexer 740 to select, in one phase, a normal pulse from input A as the divider output, and, in a complementary phase, a half-bit delayed pulse from input B as the divider output. The advantage of the clocked multiplexer 740 is that there are fewer gates between the last clocked latch and the final divider output, in turn resulting in less final output timing jitter.

The second difference, not specifically shown in FIG. 7, is that the PRESET output of delay counter 730 is simply a buffered output of a latch analogous to latch 502 of FIG. 5A, rather than being the output of an AND gate such as 512 of FIG. 5A. This change provides a longer PRESET pulse to count-down counter 720, which eases the timing requirements in counter 720.

Figure 8:
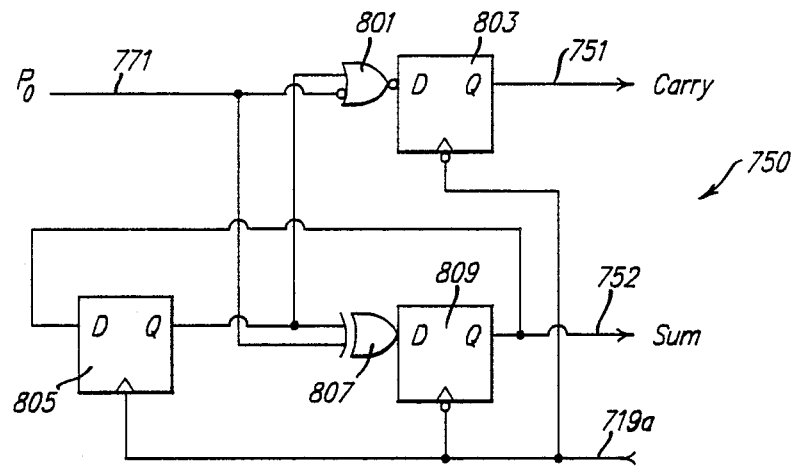
FIG. 8 is a functional block diagram of adder-accumulator 750 of FIG. 7.
Figure 9:
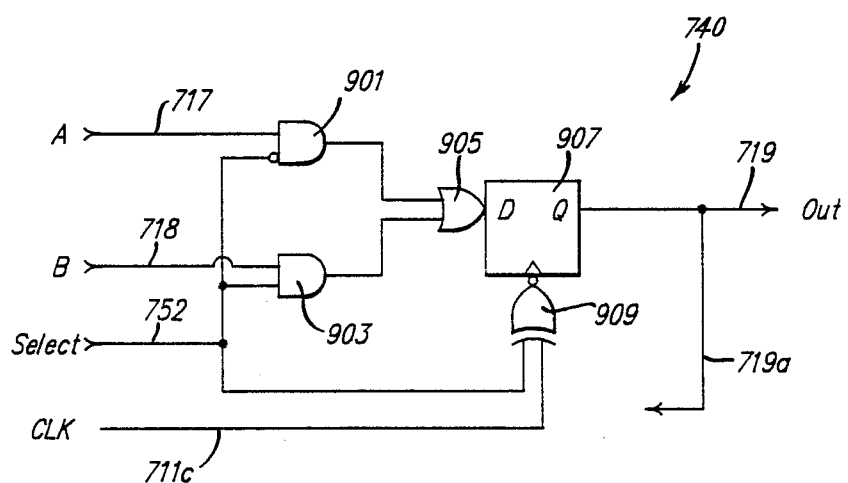
FIG. 9 is a functional block diagram of clocked multiplexer 740 of FIG. 7.

Adder-accumulator 750 and multiplexer 740 of FIG. 7 are set forth in more functional detail in FIGS. 8 and 9, respectively. The remaining functional blocks of FIG. 7 are identical to their counterparts in FIG. 1, with the exception of the PRESET output of delay counter 730 discussed above.

With reference to FIG. 8, program bit PO at bus lead 771 is coupled to an inverting input of NOR gate 801 which has been coalesced into the D input of clocked latch 803. Additionally, lead 771 is coupled to a first input of exclusive OR gate 807 which has been coalesced into the D input of clocked latch 809. A clock signal for adder-accumulator 750 is taken from the output of multiplexer 740 at lead 719a and is coupled to clock inputs for latches 803, 805, and 809 of adder-accumulator 750. The CARRY output at path 751 is taken from a Q output of latch 803, while the SUM output at path 752 is taken from a Q output of latch 809 The Q output of latch 809 is additionally coupled to a D input of latch 805, whose Q output is coupled to a second input to exclusive OR gate 807 and to a non-inverting input of NOR gate 801.

With reference to FIG. 9, the A input to multiplexer 740 at path 717 is coupled to a non-inverting input of AND gate 901, while the B input at path 718 is coupled to a first input to AND gate 903. A select input at path 752 (which is coupled to the SUM output of the accumulator of FIG. 8) is coupled to a first input of exclusive NOR gate 909, a second input to AND gate 903 and an inverting input to AND gate 901. A clock input CLK at path 711c to multiplexer 740 is coupled to a second input to gate 909 which is coalesced into a clock input for D-type latch 907 The output of gates 901 and 903 are respectively coupled to first and second inputs to OR gate 905 which is coalesced into the D input of latch 907. A Q output of latch 907 serves as a divider output at path 719 and as a source of clock pulses at path 719a for adder-accumulator 750 of FIGS. 7 and 8.

The invention has been described with reference to illustrative embodiments, the details of which have been given for the sake of example only. The scope and spirit of the invention is to be defined by the appended claims.

What is claimed is:

1. A programmable divider for dividing a frequency of an input signal, the programmable divider comprising:

a prescaler having an input coupled for receipt of the input signal and operative to divide the input signal frequency by a prescaler modulus, and to present the divided frequency signal at a prescaler output; and a programmable counter comprising:

a presettable count-down counter having a clock input coupled to the prescaler output, data input means for receipt of variable divisor data and an output, the presettable count-down counter operative to generate an end-of-count pulse at its output whenever a number of pulses received from the prescaler output at the count-down counter clock input equals a number represented by the variable divisor data;

a delay counter coupled to the prescaler output and to the presettable count-down counter and having first and second outputs;

delay counter control means coupled to the delay counter; and selection means coupled to the first and second outputs of the delay counter and to the delay counter control means and having an output;

the delay counter, the delay counter control means and the selection means operative as connected to disable the presettable count-down counter for a first number of prescaler output pulses from the receipt of an output pulse from the count-down counter and for a second number of prescaler output pulses from receipt of the output pulse of the count-down counter on alternating count-down counter operating cycles, such that the first and second outputs of the delay counter are passed to the selection means output on alternating cycles of programmable divider operation, with the first delay counter output delayed one-half period of the prescaler output pulse frequency with respect to the second delay counter output.

2. The programmable divider of claim 1 wherein the prescaler is arranged such that its output comprises a voltage difference between two symmetrical active nodes such that a complement of the prescaler output signal is available with substantially no delay, and wherein both positive-going and negative-going edges of the prescaler output signal are used by the delay counter.

3. The programmable divider of claim 1 wherein the presettable count-down counter comprises a ripple counter and wherein the data input means comprises a plurality of parallel input data lines for carrying the divisor data, one ripple counter stage being coupled to each input data line.

4. The programmable divider of claim 3 wherein the ripple counter includes decoding logic having a plurality of nodes, each node associated with at least one of the ripple counter stages and means for presetting both the ripple counter stages and the decoding logic nodes in accordance with data presented to the ripple counter via the input data lines.

5. The programmable divider of claim 1 wherein the delay counter control means comprises an adder-accumulator having a control input coupled to one of the input data lines, a clock input coupled to the second delay counter output, a carry output coupled to a control input of the delay counter and a sum output coupled to the selection means, the adder-accumulator operative to add an input signal bit presented to the one of the input data lines to a previous state of the accumulator whenever the clock input undergoes a predetermined transition and to provide appropriate sum and carry logic state information at the sum and carry outputs, respectively, the carry output determining which of the first and second numbers of prescaler output pulses is to be used as a disabling time period for the count-down counter, and the sum output determining which of the first and second outputs of the delay counter is to be passed to the selection means output.

6. The programmable divider of claim 5 wherein the selection means comprises a multiplexer having first and second inputs respectively coupled to the first and second outputs of the delay counter and a selection control input coupled to the sum output of the adder-accumulator, one of the first and second multiplexer inputs being coupled to a multiplexer output in accordance with a binary logic state of the selection control input.

7. The programmable divider of claim 6 further comprising a differential output buffer having an input coupled to the multiplexer output and complementary outputs serving as outputs of the programmable divider.

8. The programmable divider of claim 3 wherein the delay counter control means comprises an adder-accumulator having a control input coupled to one of the input data lines, a clock input coupled to the selection means output, a carry output coupled to a control input of the delay counter and a sum output coupled to the selection means, the adder-accumulator operative to add an input signal bit presented to the one of the input data lines to a previous state of the accumulator whenever the clock input undergoes a predetermined transition and to provide appropriate sum and carry logic state information at the sum and carry outputs, respectively, the carry output determining which of the first and second numbers of prescaler output pulses is to be used as a disabling time period for the count-down counter, and the sum output determining which of the first and second outputs of the delay counter is to be passed to the selection means output.

9. The programmable divider of claim 8 wherein the selection means comprises a multiplexer having first and second inputs respectively coupled to the first and second outputs of the delay counter, a selection control input coupled to the sum output of the adder-accumulator, and a clock input coupled to the prescaler output, the multiplexer including clocked latch means operable upon a predetermined transition of a signal presented to the clock input to couple one of the first and second multiplexer inputs to a latch means output in accordance with a logic state of the selection control input.

* * * * *